United States Patent [19]

Imai et al.

[11] Patent Number: 4,863,529

[45] Date of Patent: Sep. 5, 1989

[54] THIN FILM SINGLE CRYSTAL DIAMOND SUBSTRATE

[75] Inventors: Takahiro Imai; Naoji Fujimori, both of Itami, Japan

[73] Assignee: Sumitomo Electric Industries, Ltd., Japan

[21] Appl. No.: 165,711

[22] Filed: Mar. 8, 1988

[30] Foreign Application Priority Data

Mar. 12, 1987 [JP] Japan .................................. 62-58381
Mar. 12, 1987 [JP] Japan .................................. 62-58382

[51] Int. Cl.$^4$ ..................... C30B 25/02; C30B 29/04; C30B 25/18

[52] U.S. Cl. ................................ 148/33.4; 148/33.3; 148/DIG. 148; 437/100; 437/103

[58] Field of Search ............... 437/103, 100, 102, 105, 437/106, 165; 148/33.4, DIG. 148, 33; 156/610, DIG. 64, DIG. 68

[56] References Cited

U.S. PATENT DOCUMENTS

4,548,658 10/1985 Cook .

FOREIGN PATENT DOCUMENTS

206603 12/1986 European Pat. Off. .
0127300 7/1985 Japan .
0042910 3/1986 Japan .
0251120 11/1986 Japan .

OTHER PUBLICATIONS

Nishino et al., Applied Physics Letters, vol. 42, No. 5, Mar. 1, 1985, pp. 460-462.

Woollam et al., "Optical and Interfacial Electronic Properties of Diamond-Like Carbon Films", *Thin Solid Films*, vol. 119, 1984, pp. 121-126.

Koeppe et al., "Summary Abstract: Characterization of Ion Beam Deposited Diamondlike Carbon Coating on Semiconductors", *J. Vac. Sci. Technol. A*, vol. 3, No. 6, Nov./Dec. 1985, pp. 2327-2328.

Nishino et al., "Production of Large-Area Single-Crystal Wafers of Cubic SiC for Semiconductor Devices", Appl. Phys. Lett., vol. 42, No. 5, Mar. 1, 1983, pp. 460-462.

Fujimori et al., "Characterization of Conducting Diamond Films," *Vacuum*, vol. 36, Nos. 1-3, pp. 99-102, 1986.

Balakov et al., "Deposition of Carbon Films with Diamondlike Properties from an Acetylene-Krypton Plasma", *Sov. Phys. Tech. Phys.*, vol. 27, No. 4, Apr. 1982, pp. 521-522.

Warner et al., "Plasma Deposited Hydrogenated Carbon on GaAs and InP", *J. Vac. Sci. Technol. A*, vol. 3, No. 3, May/Jun. 1985, pp. 900-903.

Sawabe et al., "Growth of Diamond Thin Films by Electron Assisted Chemical Vapor Deposition", *Appl. Phys. Lett.*, vol. 46, No. 2, Jan. 15, 1985, pp. 146-147.

Sawabe et al., "Growth of Diamond Thin Films by Electron-Assisted Chemical Vapour Deposition and Their Characterization", *Thin Solid Films*, vol. 137, No. 1, Mar. 1, 1986, pp. 89-99.

*Primary Examiner*—Brian E. Hearn
*Assistant Examiner*—Mary Wilczewski
*Attorney, Agent, or Firm*—Cushman, Darby & Cushman

[57] ABSTRACT

A thin film single crystal diamond substrate which comprises a base substrate selected from the group consisting of a single crystal silicon substrate and a single crystal GaAs substrate, an intermediate layer consisting of single crystal silicon carbide formed on the base substrate and a thin film of single crystal diamond which is epitaxially grown on the intermediate layer, which can have a large area and be easily and economically produced.

4 Claims, 1 Drawing Sheet

THIN FILM SINGLE CRYSTAL DIAMOND SUBSTRATE

BACKGROUND OF THE INVENTION

1. Field of the Invention

The present invention relates to a thin film single crystal diamond substrate. More particularly, it relates to a substrate which comprises a thin film of epitaxially grown single crystal and is useful for a diamond base semiconductor device.

2. Description of the Prior Art

A semiconductive material for use in the production of a semiconductor device should be in the form of highly pure single crystal or of a layer of highly pure single crystal. In the production of a currently widely used planar type semiconductor devices, the formation of a thin film of a single crystal is an essential step of the production.

While silicon is conventionally used as a semiconductive material, application of diamond for a heat resistant semiconductor, a high power transistor and the like has been sought since the diamond has unique characteristics as a semiconductive material.

At present, only a single crystal diamond is industrially produced by an extra-high pressure apparatus, and a substrate made from such synthetic diamond particle has at most an area of several millimeter square. Therefore, the conventional single crystal diamond substrate cannot be used when a substrate having a large area is required for producing a large current device or when an integrated circuit is produced by microprocessing with a stepper. In addition, the high cost of the synthetic diamond prevents its wide use in the mass production of semiconductor.

Recently, a chemical vapor deposition (CVD) method has been developed, in which a mixed gas of, for example, methane and hydrogen is excited and reacted by microwave plasma or heating and a diamond thin film is deposited on a base plate, and a single crystal diamond film is epitaxially grown on a single crystal diamond substrate (Fujimori et al, Vacuum, 36, 99–102 (1986) the disclosure of which is hereby incorporated by reference).

However, by the CVD method, a polycrystal diamond film is formed on a silicon or gallium-arsenide (GaAs) substrate, and a single crystal diamond film can be formed only on the single crystal diamond substrate having a small area. Thus, it is desired to provide a thin film single crystal diamond substrate which is economically produced and has a large area.

SUMMARY OF THE INVENTION

One object of the present invention is to provide a thin film single crystal diamond substrate having a large area.

Another object of the present invention is to provide a thin film single crystal diamond substrate in which single crystal diamond is epitaxially grown on a single crystal silicon substrate.

Further object of the present invention is to provide a thin film single crystal diamond substrate in which single crystal diamond is epitaxially grown on a single crystal GaAs substrate.

These and other objects are achieved by a thin film single crystal diamond substrate which comprises a base substrate selected from the group consisting of a single crystal silicon substrate and a single crystal GaAs substrate, an intermediate layer consisting of single crystal silicon carbide formed on the base substrate and a thin film of single crystal diamond which is epitaxially grown on the intermediate layer.

DETAILED DESCRIPTION OF THE INVENTION

Since the diamond has a lattice constant of 3.5667 Å while silicon and GaAs have lattice constants of 5.4301 Å and 5.6419 Å, respectively, the diamond cannot be epitaxially grown directly on the silicon or GaAs substrate. However, when the intermediate layer of silicon carbide having a lattice constant of 4.3596 Å is present, the diamond is epitaxially grown on the silicon carbide intermediate layer.

The single crystal silicon or GaAs base substrate may be a wafer prepared by cutting an ingot which is produced by a conventional method such as the Czochralski (CZ) method, the Liquid Encapsulated Czochralski (LEC) method and the like.

The intermediate layer of silicon carbide and the thin film single crystal may be formed by the known CVD method. A typical CVD method for forming the silicon carbide film and the single crystal film is described in, for example, S. Nishino and J. A. Powel, Appl. Phys. Lett., 42 (1983) 460, the disclosure of which is hereby incorporated by reference.

The thickness of silicon carbide intermediate layer is from 20 to 10,000 Å, preferably from 50 to 2,000 Å, and the thickness of single crystal diamond film is from 0.01 to 100 μm, preferably from 0.05 to 2 μm.

The single crystal diamond may be doped with boron, phosphorus, sulfur and the like.

PREFERRED EMBODIMENTS OF THE INVENTION

EXAMPLE 1

The (111) plane of a single crystal silicon substrate of 2 inches in diameter was carbonized for 20 minutes in an atmosphere of methane under 5 Torr. at 1,350° C. Then, on the carbonized surface of silicon substrate, a single crystal silicon carbide layer of 2,000 Å was formed by the plasma CVD method in an atmosphere of monosilane ($SiH_4$) and methane under 2 Torr. at a substrate temperature of 1,300° C.

On the silicon carbide intermediate layer, diamond was grown to a thickness of 3,000 Å by the microwave plasma CVD method in an atmosphere of hydrogen containing 0.5 % of methane under 30 Torr. at a substrate temperature of 900° C.

Figure 1:
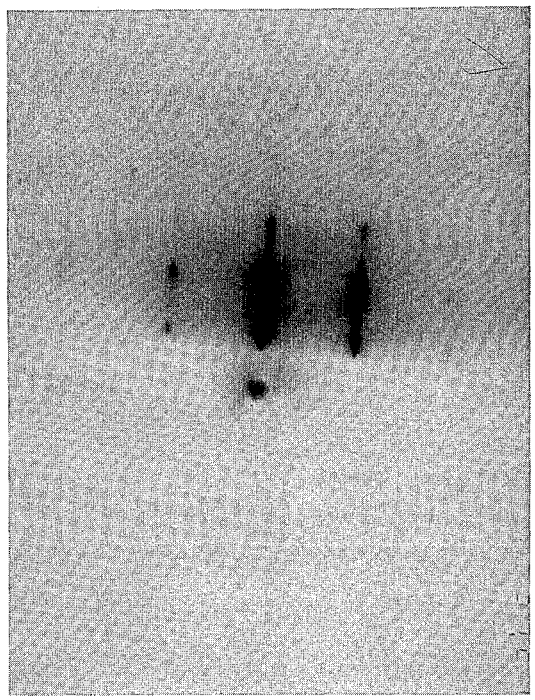
FIGS. 1 and 2 are photographs of diffraction images observed in reflective electron beam diffraction of the diamond thin films produced in Examples 1 and 3, respectively.

The crystal structure of the diamond thin film was analyzed by reflection electron beam diffraction. A spot form diffraction image was observed as shown in the photograph of FIG. 1, which indicated the (111) plane of the single crystal.

EXAMPLE 2

In the same manner as in Example 1, an intermediate layer of single crystal silicon carbide was formed on the silicon substrate. Then, on the silicon carbide intermediate layer, diamond was grown to a thickness of 500 Å by exciting and decomposing hydrogen containing 0.5 % of methane with a tungsten filament heated at 2,100° C. under 30 Torr. at a substrate temperature of 850° C. according to the CVD method. Thereafter, hydrogen containing 0.5 % of methane and 0.0002 % of diborane ($B_2H_6$) was excited and decomposed in the same manner as in the previous step to form a thin film of diamond doped with boron having a thickness of 1,000 Å.

The crystal structure of the boron-doped diamond thin film was analyzed by reflection electron beam diffraction. A spot form diffraction image was observed, which indicated the (111) plane of the single crystal.

The single crystal diamond film had a resistivity of $5\times10^{-1}$ ohm.cm. By the measurement of the Hall effect, the diamond film was identified as a P-type semiconductor having a carrier density of $4\times10^{16}/cm^3$ and Hall mobility of 310 $cm^2/V.sec$.

COMPARATIVE EXAMPLE 1

In the same manner as in Example 1 but forming no intermediate layer, diamond was deposited directly on the silicon substrate. Discrete diamond particles were deposited but no thin film of diamond was formed.

After scratching the surface of the silicon substrate with diamond powder (#3000), diamond was deposited directly on the silicon substrate in the same manner as in Example 1 to obtain a film in which triangular crystal planes were unevenly present. The crystal structure was observed by electron beam diffraction to find that the diamond was polycrystal.

EXAMPLE 3

On a surface of a GaAs substrate of 2 inches in diameter, a single crystal silicon carbide layer of 2,000 Å was formed by the plasma CVD method in an atmosphere of $SiH_4$ and methane under 2 Torr. at a substrate temperature of 1,300° C.

On the silicon carbide intermediate layer, diamond was grown to a thickness of 3,000 Å by the microwave plasma CVD method in an atmosphere of hydrogen containing 0.5% of methane under 30 Torr. at a substrate temperature of 900° C.

Figure 2:
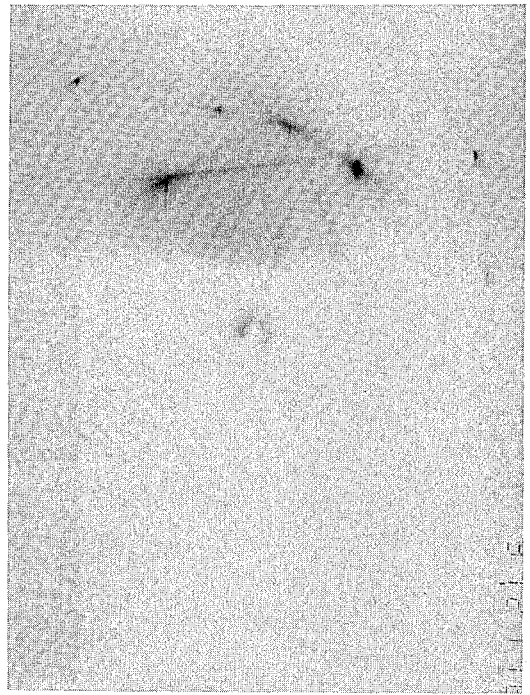

The crystal structure of the diamond thin film was analyzed by reflection electron beam diffraction. A spot form diffraction image was observed as shown in the photograph of FIG. 2, which indicated the (111) plane of the single crystal.

EXAMPLE 4

In the same manner as in Example 3, an intermediate layer of single crystal silicon carbide was formed on the GaAs substrate. Then, on the silicon carbide intermediate layer, diamond was grown to a thickness of 500 Å by exciting and decomposing hydrogen containing 0.5% of methane with a tungsten filament heated at 2,100° C. under 30 Torr. at a substrate temperature of 850° C. according to the CVD method. Thereafter, hydrogen containing 0.5 % of methane and 0.0002% of $B_2H_6$ was excited and decomposed in the same manner as in the previous step to form a thin film of diamond doped with boron having a thickness of 1,000 Å.

The crystal structure of the boron-doped diamond thin film was analyzed by reflection electron beam diffraction. A spot form diffraction image was observed, which indicated the (111) plane of the single crystal.

The single crystal diamond film had a resistivity of $9\times10^{-1}$ ohm.cm. By the measurement of the Hall effect, the diamond film was identified as a P-type semiconductor having a carrier density of $1.5\times10^{16}/cm^3$ and Hall mobility of 430 $cm^2/V.sec$.

COMPARATIVE EXAMPLE 2

In the same manner as in Example 3 but forming no intermediate layer, diamond was deposited directly on the GaAs substrate. Discrete diamond particles were formed but no thin film of diamond was deposited.

After scratching the surface of the GaAs substrate with diamond powder (#3000), diamond was deposited directly on the substrate in the same manner as in Example 3 to obtain a film in which triangular crystal planes were unevenly present. The crystal structure was observed by electron beam diffraction to find that the diamond was polycrystal.

What is claimed is:

1. A thin film single crystal diamond substrate which comprises a base substrate selected from the group consisting of a single crystal silicon substrate and a single crystal GaAs substrate, an intermediate layer consisting of single crystal silicon carbide formed on the base substrate and a thin film of single crystal diamond which is epitaxially grown on the intermediate layer.

2. The thin film single crystal diamond substrate according to claim 1, wherein the diamond is doped with boron.

3. The thin film single crystal diamond substrate according to claim 1, wherein the base substrate is the single crystal silicon substrate.

4. The thin film single crystal diamond substrate according to claim 1, wherein the base substrate is the single crystal GaAs substrate.

* * * * *